US008907691B2

(12) United States Patent
Patterson

(10) Patent No.: US 8,907,691 B2
(45) Date of Patent: Dec. 9, 2014

(54) INTEGRATED CIRCUIT THERMALLY INDUCED NOISE ANALYSIS

(75) Inventor: Joseph Martin Patterson, Carlsbad, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 1321 days.

(21) Appl. No.: 12/490,729

(22) Filed: Jun. 24, 2009

(65) Prior Publication Data

US 2010/0327875 A1 Dec. 30, 2010

(51) Int. Cl.
*G01R 31/303* (2006.01)
*G01R 31/28* (2006.01)

(52) U.S. Cl.
CPC .......... *G01R 31/2875* (2013.01); *G01R 31/303* (2013.01)
USPC ................................ 324/754.23; 324/754.21

(58) Field of Classification Search
USPC ........................................ 324/754.23, 754.21
See application file for complete search history.

(56) References Cited

U.S. PATENT DOCUMENTS

| | | | | |
|---|---|---|---|---|
| 4,806,774 | A * | 2/1989 | Lin et al. | 250/550 |
| 4,853,622 | A * | 8/1989 | Brust | 324/754.21 |
| 6,051,828 | A | 4/2000 | Patterson | |
| 6,850,081 | B1 * | 2/2005 | Birdsley et al. | 324/754.23 |
| 7,034,298 | B2 * | 4/2006 | Miyai et al. | 250/310 |
| 7,729,528 | B2 * | 6/2010 | O'Dell et al. | 382/149 |
| 2003/0063791 | A1 * | 4/2003 | Smilansky et al. | 382/145 |
| 2009/0037134 | A1 * | 2/2009 | Kulkarni et al. | 702/127 |

OTHER PUBLICATIONS

Zheng et al., "A Novel Fault Isolation Technique Using Noise Detection and Characterization of Light Emitted from Integrated Circuits", Proceedings from the 24th International.

* cited by examiner

*Primary Examiner* — Jeff Natalini
(74) *Attorney, Agent, or Firm* — Amin, Turocy & Watson, LLP

(57) ABSTRACT

A system and method are provided for testing an integrated circuit (IC) using thermally induced noise analysis. The method provides an IC die and supplies electrical power to the IC die. The IC die surface is scanned with a laser, and the laser beam irradiated locations on the IC die surface are tracked. The laser scanning heats active electrical elements underlying the scanned IC die surface. A frequency response of an IC die electrical interface is measured and correlated to irradiated locations. IC die defect regions are determined in response to identifying location-correlated frequency measurements exceeding a noise threshold. For example, a frequency measurement may be correlated to a die surface location, and if frequency measurement exceeds the noise threshold, then circuitry underlying that surface area may be identified as defective. Typically, die defect regions are associated with measurements in the frequency range between about 1 Hertz and 10 kilohertz.

20 Claims, 8 Drawing Sheets

INTEGRATED CIRCUIT THERMALLY INDUCED NOISE ANALYSIS

BACKGROUND OF THE INVENTION

1. Field of the Invention

This invention generally relates to integrated circuit (IC) fabrication and, more particularly, to a method for accurately detecting defects in an IC using thermally induced frequency measurements of electrical signals.

2. Description of the Related Art

IC devices are formed from a die of active semiconductor devices. The die can be mounted in a hybrid circuit, printed circuit board (PCB), or a package. For environmental protection, the die may be covered by a passivation layer. However, a package is more typically used since it also dissipates heat and provides a lead system for electrical connections. There are many different types of packages including through-hole, surface mount device (SMD) dual/quad, and SMD area array packages.

FIG. 1 is a perspective view of a dual in-line package (DIP) (prior art). It is common for a package body or lead frame 100 to have a die attach area 102. The die 106 has electrical contact pads on its top surface. Inner leads 108 connect pads on die top surface to outer leads or lead frames 110. Once the inner leads are bonded to the lead frames, the package is sealed with ceramic, in a metal can, or in a polyimide. Epoxy resins are also a common choice. Glass beads are commonly mixed in with the epoxy to reduce strain in the epoxy film during changes in temperature.

Optical beam induced current (OBIC) is a semiconductor analysis technique performed using laser signal injection. The technique induces current flow in the semiconductor sample through the use of a laser light source. This technique is used in semiconductor failure analysis to locate buried diffusion regions, damaged junctions, and gate oxide shorts.

The OBIC technique may be used to detect the point at which a focused ion beam (FIB) milling operation in bulk silicon of an IC must be terminated. This is accomplished by using a laser to induce a photocurrent in the silicon, while simultaneously monitoring the magnitude of the photocurrent by connecting an ammeter to the device's power and ground. As the bulk silicon is thinned, the photocurrent increases as the depletion region of the well to substrate junction is reached. FIB milling operations are terminated in a region below the well depth, so the device remains operational.

Thermally Induced Voltage Alteration (TIVA) laser imaging techniques can also be used to electrically detect optical transmission through thin packages. The enclosed integrated circuit acts as a detector while the laser is scanned on the outside of the package. In one aspect, the TIVA laser causes some heating of the IC and the resultant resistance change is detected electronically through the leads of the device. The OBIC laser causes the generation of electron-hole pairs in the crystal silicon die that results in a current that is then detected as a voltage at the pins of the device. In some aspects, both lasers are used simultaneously.

FIG. 2 depicts an exemplary system for detecting optical paths through an IC package (prior art). Selected power pins from the IC are connected to a sense amp 300, as are the IC grounds. A laser 302 scans an area of an IC package 304 overlying the die (not shown). The scanning area is defined by an x-y coordinate system. The IC package 304 is mounted on a movable table 306. Alternately, the IC package position is fixed and the laser moves. The scan pattern need not necessarily follow the x-y grid. In some aspects, only selected areas of the package surface over the die are scanned.

FIG. 3 is a detailed schematic of a sense amplifier (prior art). The sense amplifier 400 connects lines V+ and S+ to IC power supply lines, while inputs V− and S− are typically connected to ground. In other aspects, the sense amplifier lines may be connected to signal inputs or signal outputs. Imaging is performed through the top of the package. Electrical connections are made to the power supply pins of the device and those connections go to a current amplifier for video imaging the package surface as the OBIC laser is scanned. The OBIC laser has a 1065 nanometers wavelength and does not ablate the epoxy mold compound. The optical path (OBIC or TIVA) testing lasers typically use a power of less than 100 milliwatts.

However, using OBIC and TIVA techniques, it is difficult to distinguish between defect and normally operating circuitry. That is, there are many sites that are thermally sensitive and produce a response and shows up in images. Not all of these sites are defects. It is not adequate to compare the image of a good reference unit to the unit under test, because a defect can induce connected non-defective circuit elements to behave differently than the corresponding circuitry in the reference unit.

Typically, destructive physical analysis follows the TIVA analysis and the results of the TIVA analysis are used to determine the direction in which the destructive physical analysis should proceed. For example, time consuming and destructive techniques such as mechanical micro-probing or cross-sectioning may be employed. If multiple sites are indicated, and the diagnosis is ambiguous, then the physical analysis may inadvertently destroy the true failure site.

An analysis of noise (frequency) provides more information than simple voltage and current analysis. To that end, the light emissions from an integrated circuit can be collected using a low light sensitive camera or discrete light defector (Zheng et al., "A Novel Fault Isolation Technique Using Noise Detection and Characterization of Light Emitted from Integrated Circuits", Proceedings from the 24$^{th}$ International Symposium for Testing and Failure Analysis, Nov. 15-19, 1998, pp. 467-471). However, it is not possible to access every potential defect region so that optical data can be collected. Further, while the TIVA method suffers from the above-mentioned limits, it has the advantage of using a laser to heat the sample as a means of inducing defect measurement. The optical method provides no means of using temperature to enhance noise measurements.

It would be advantageous if a method existed to more positively differentiate defect sites from non-defect sites in an IC, without resulting to physical analysis or probing.

It would be advantageous if a means existed for using electrical signal noise (frequency) analysis to identify IC defect regions. It would be advantageous if a laser could be used, inducing noise measurements with high temperatures.

SUMMARY OF THE INVENTION

Described herein is a method for using a spectrum analyzer to monitor electrical signals, and synchronize the level and type of noise with the X-Y location of the laser beam that induces the signal. The laser heats the sample point by point. Defects typically produce more noise and noise with characteristic signatures, as compared to non-defect sites that might also be thermally sensitive. Also, the noise generated by defects typically increases at a higher rate when heated, as compared to the noise from normal (non-defect) sites. The noise data can also be combined with more conventional thermally induced voltage alteration (TIVA) analysis.

The method monitors an electrical signal from the IC as it is scanned by a laser. The output of the spectrum analyzer is examined for noise content. A plot is made of noise amplitude versus frequency, which is examined for abnormally high amplitude or abnormal frequency distribution of the noise. Correlation of abnormal noise to the physical location on the IC is made to identify defects sites.

Accordingly, a method is provided for testing an integrated circuit (IC) using thermally induced noise analysis. The method provides an IC die and supplies electrical power to the IC die. The IC die surface is scanned with a laser, and the laser beam irradiated locations on the IC die surface are tracked. The laser scanning heats active electrical elements underlying the scanned IC die surface. A frequency response of an IC die electrical interface is measured and correlated to irradiated locations. IC die defect regions are determined in response to identifying location-correlated frequency measurements exceeding a noise threshold. For example, a first frequency measurement may be correlated to a first die surface location, and if first frequency measurement exceeds the noise threshold, then circuitry underlying the first surface area may be identified as defective. Typically, die defect regions are associated with measurements in the frequency range between about 1 Hertz and 10 kilohertz.

Additional details of the above-described method and an IC thermally induced noise analysis (TINA) system are provided below.

DETAILED DESCRIPTION

Figure 1:
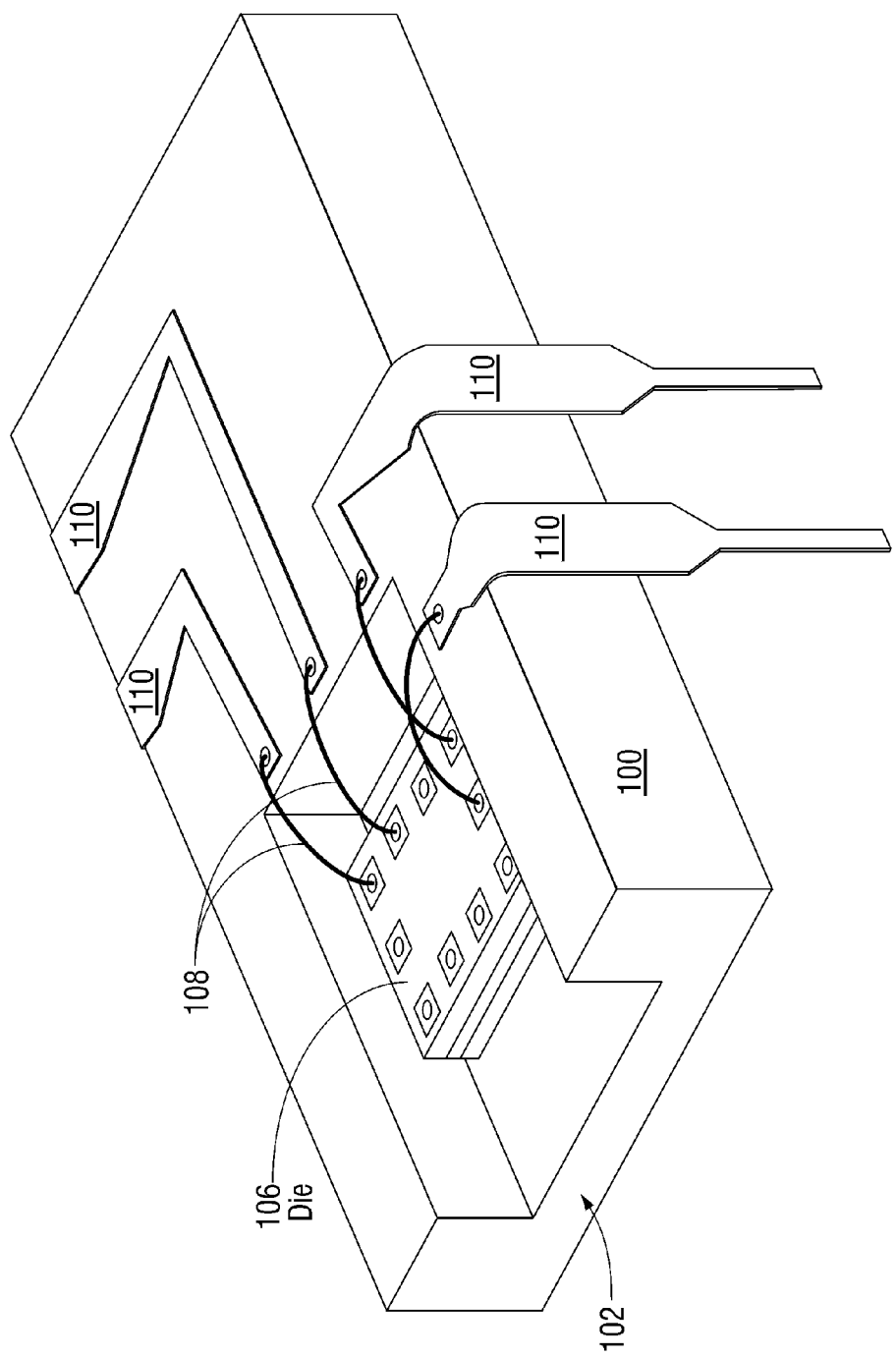
FIG. 1 is a perspective view of a dual in-line package (DIP) (prior art).
Figure 2:
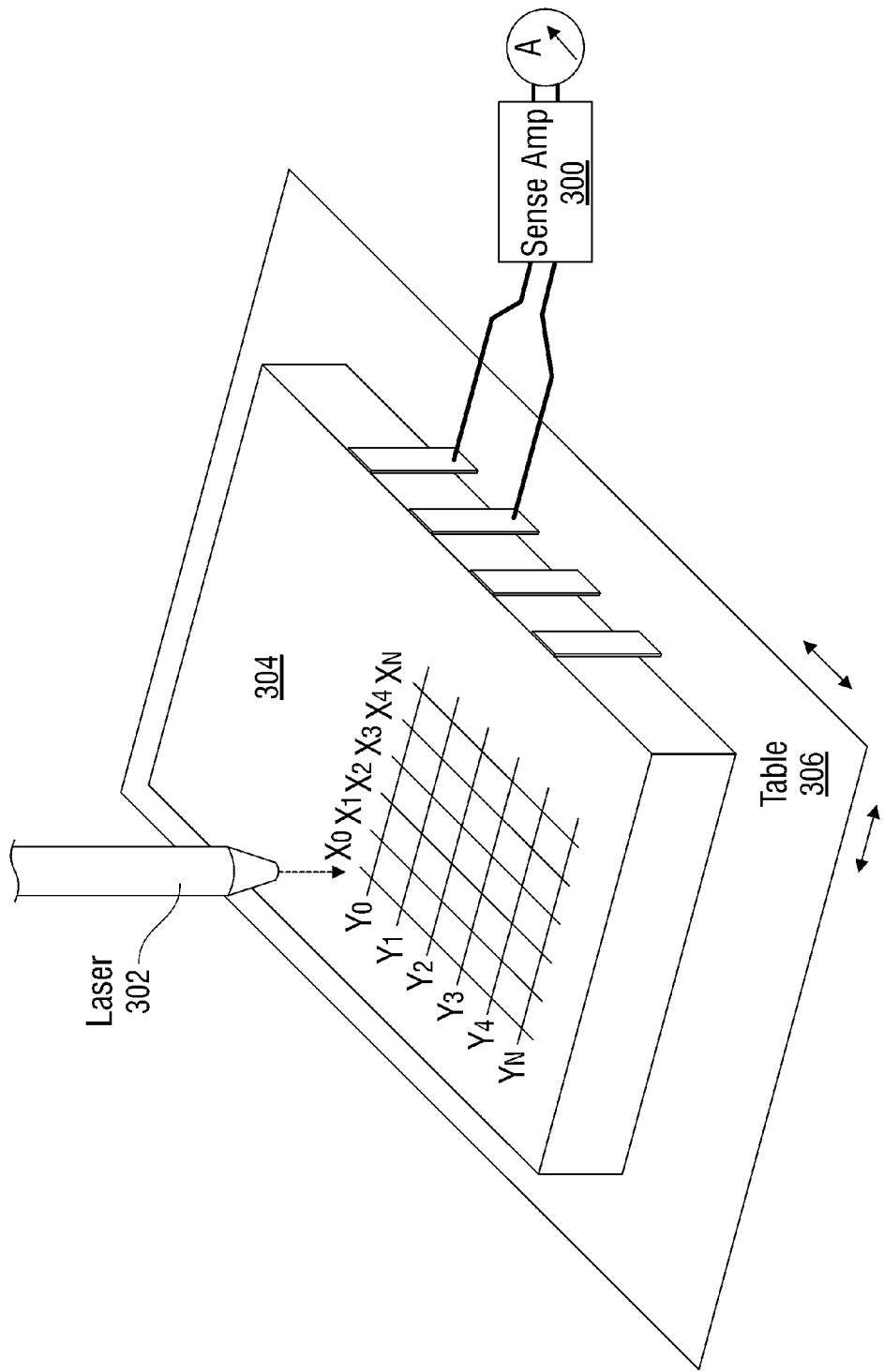
FIG. 2 depicts an exemplary system for detecting optical paths through an IC package (prior art).
Figure 3:
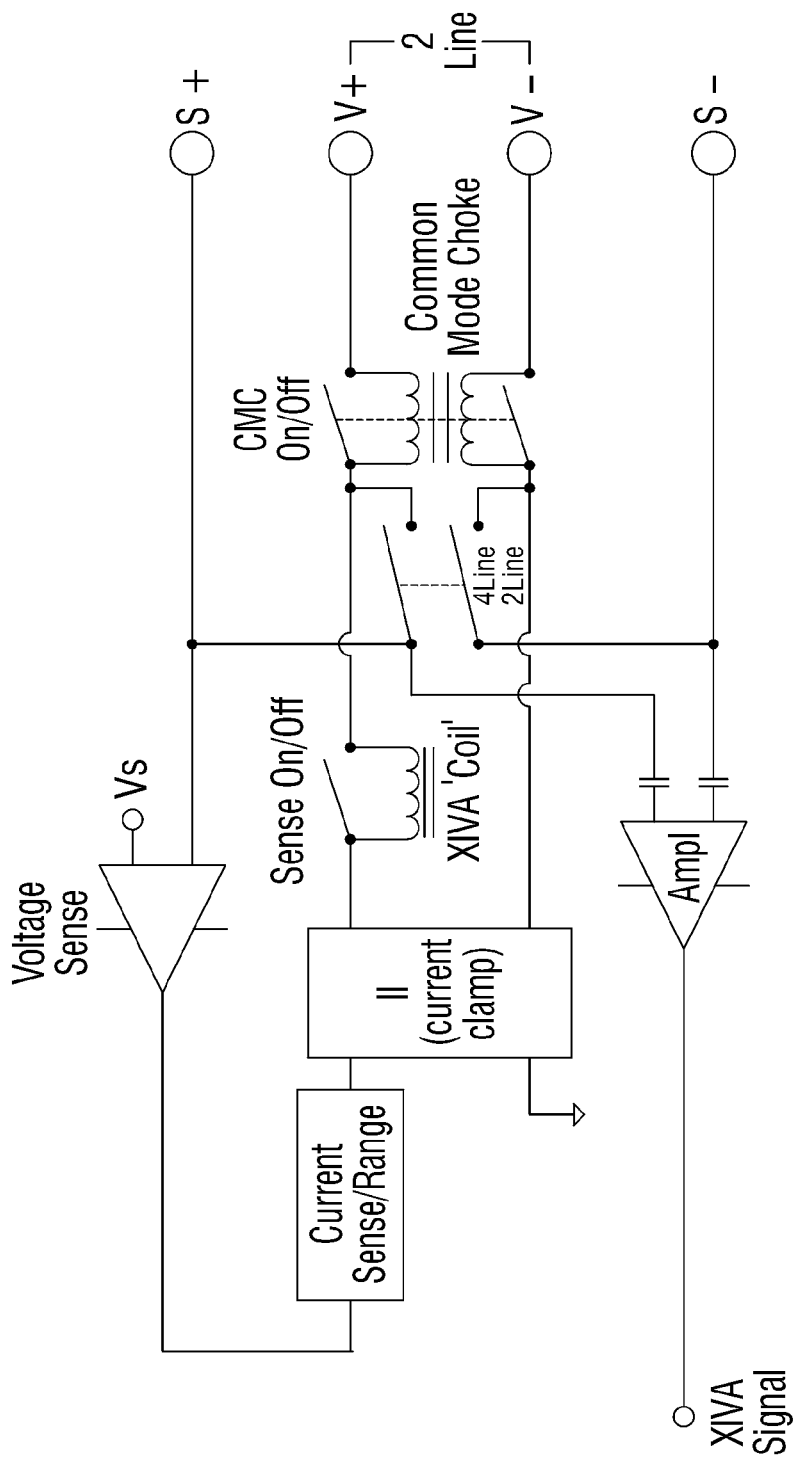
FIG. 3 is a detailed schematic of a sense amplifier (prior art).
Figure 4:
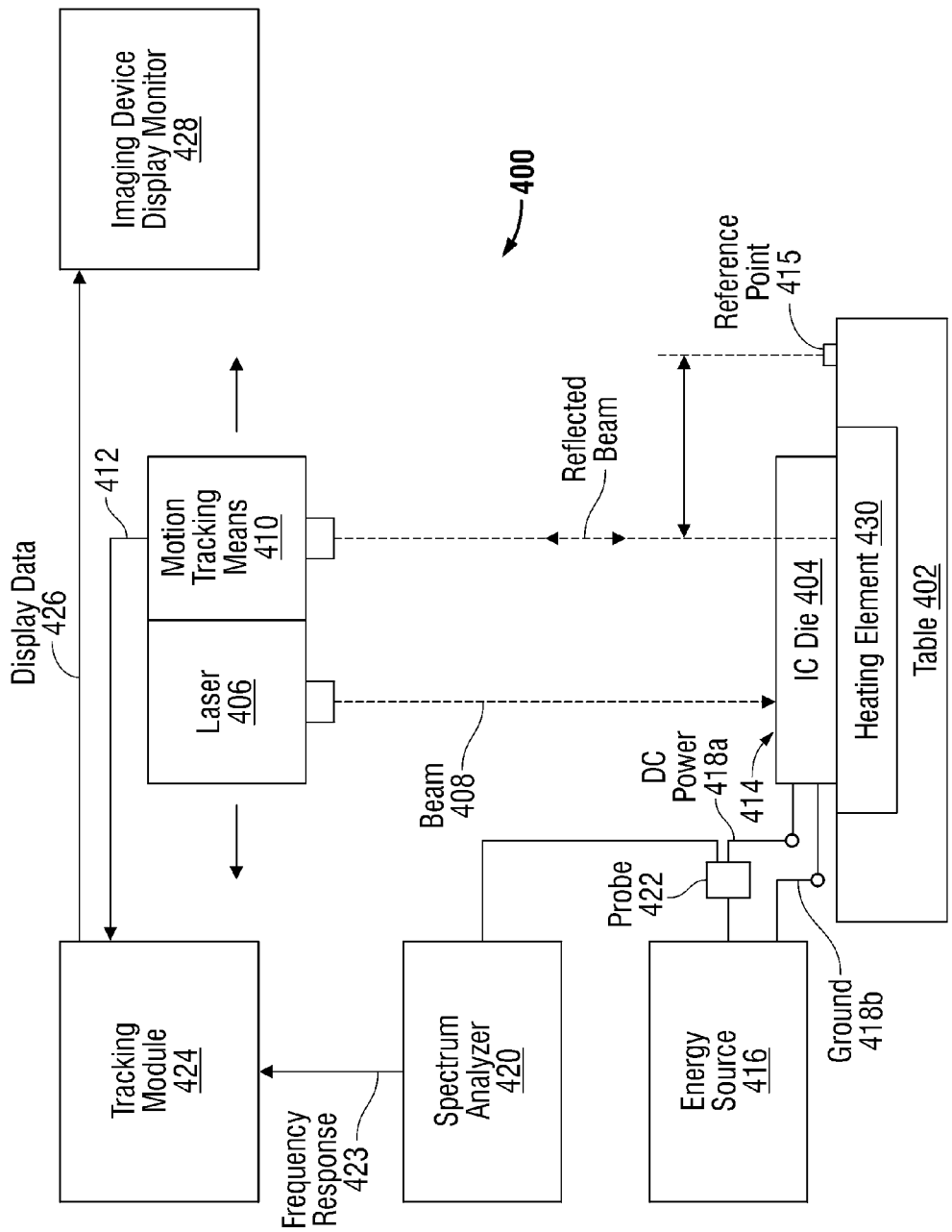
FIG. 4 is a schematic block diagram of an integrated circuit (IC) thermally induced noise analysis (TINA) system.

FIG. 4 is a schematic block diagram of an integrated circuit (IC) thermally induced noise analysis (TINA) system. The system 400 comprises a table 402 for mounting an IC die 404. A laser 406 mounted over the table 402 supplies a laser beam 408. The laser beam 408 heats active electrical elements underlying the scanned IC die surface. A motion tracking means 410 tracks the relative position of the table 402 with respect to the laser 406, and has an output on line 412 to supply a signal representing irradiated locations on the IC die surface 414. As shown, the motion tracking means 410 is mounted with the laser 406. For example, the motion tracking means 410 may be a camera, laser, or light detecting device that measures relative changes in position of the table with respect to a calibrated reference 415, which may be a mirror for example. Note: the IC die surface 414 can be irradiated by moving either the table or the laser. For simplicity the motion tracking means and laser are shown as independent systems. Typically however, a reflection of the laser that heats the sample is simultaneously used for tracking and location, using a known reference point on the IC die under test. The reflected image of a laser scanning microscope can be used for example. Such a motion tracking means is well understood in the art, and is used OBIC and TIVA systems.

An energy source 416 supplies power to an electrical interface 418 of the IC die 404. For simplicity, it is assumed that a dc voltage and ground are supplied on lines 418a and 418b. However, it should be understood that ac and pulsed signals may be supplied as an alternative, or in addition to dc signals. A spectrum analyzer 420 has a probe 422 connected the IC die electrical interface 418 and an output on line 423 to supply a signal representing frequency response measurements. In some aspects, the impedance of the IC die interface may be such (e.g., 50 ohms) that a probe is not necessary. For simplicity, the IC interface 418 supplying the power is the same interface being measured, but this need not always be the case. For example, power may be supplied on line 418, but frequency measurements made on a different IC electrical interface (not shown). Frequency response measurements in the frequency range between about 1 Hertz and 10 kilohertz are of interest because this range is known to be associated with the noise created by defective circuitry. However, the system is not necessarily limited to this frequency range, as particular circuitry may be associated with higher frequency noise, especially if high speed signals are introduced in testing the IC die.

A tracking module 424 having inputs to accept the irradiated locations from the motion tracking means 410 on line 412 and frequency response measurements on line 423. As noted above, the laser and motion tracking means may be the same system. Then, the laser beam is scanned over a surface with a mirror(s) in a known reference position. The position of the mirrors tracks beam position, and the reflections are used to reference the locations on the IC die surface. The tracking module 424 correlates frequency response measurements to IC die surface locations, and has an output on line 426 to supply a signal representing IC die defect regions determined in response to location-correlated frequency measurements exceeding a noise threshold. The noise threshold is a frequency amplitude or spectral density value that is dependent upon a number of variables such as circuitry, dc power, ac signal stimulus, frequency, frequency envelop (pattern), and temperature, to name a few. The tracking module 424 may be enabled in hardware using memory and comparators. Alternately, the tracking module may be at least partially enabled using a processor (not shown) that executes software instructions that are stored in a memory medium.

In one aspect, the tracking results on line 426 are stored in memory. Alternately, the results may be displayed. For example, the tracking module 424 may supply display data representing the IC die surface and location-correlated frequency measurements exceeding the noise threshold. Then, the system 100 may further comprise an imaging device 428, such as a display monitor or printer, having an input to accept the display data from the tracking module 424 and an output to supply an image depicting IC die defect regions on the IC die surface. As shown, the imaging device 428 is a display monitor, and the output would be a video image.

In one aspect the laser 406 scans the IC die surface 414 at a first power level in a first scan, and then scans the IC die at a second power level, greater than the first power level, in a second scan. The tracking module 424 compares a difference in frequency measurement amplitudes between the first and second scans, and if the difference exceeds a noise delta threshold, correlates the difference measurement to an IC die location. The location is identified as an IC die defect region, or potential defect region.

In another aspect, the table includes a heating element 430 to heat the IC die 404 to a first temperature prior to (and during) laser scanning. Then, the laser 406 instantaneously heats local regions of the IC die to a second temperature, greater than the first temperature. The tracking module 424 compares the difference in frequency measurement amplitudes between the frequency response measurements taken at the first and second temperatures. If the difference exceeds a noise delta threshold, the tracking module 424 correlates the difference measurement to an IC die location, and identifies the location as an IC die defect region.

Figure 5:
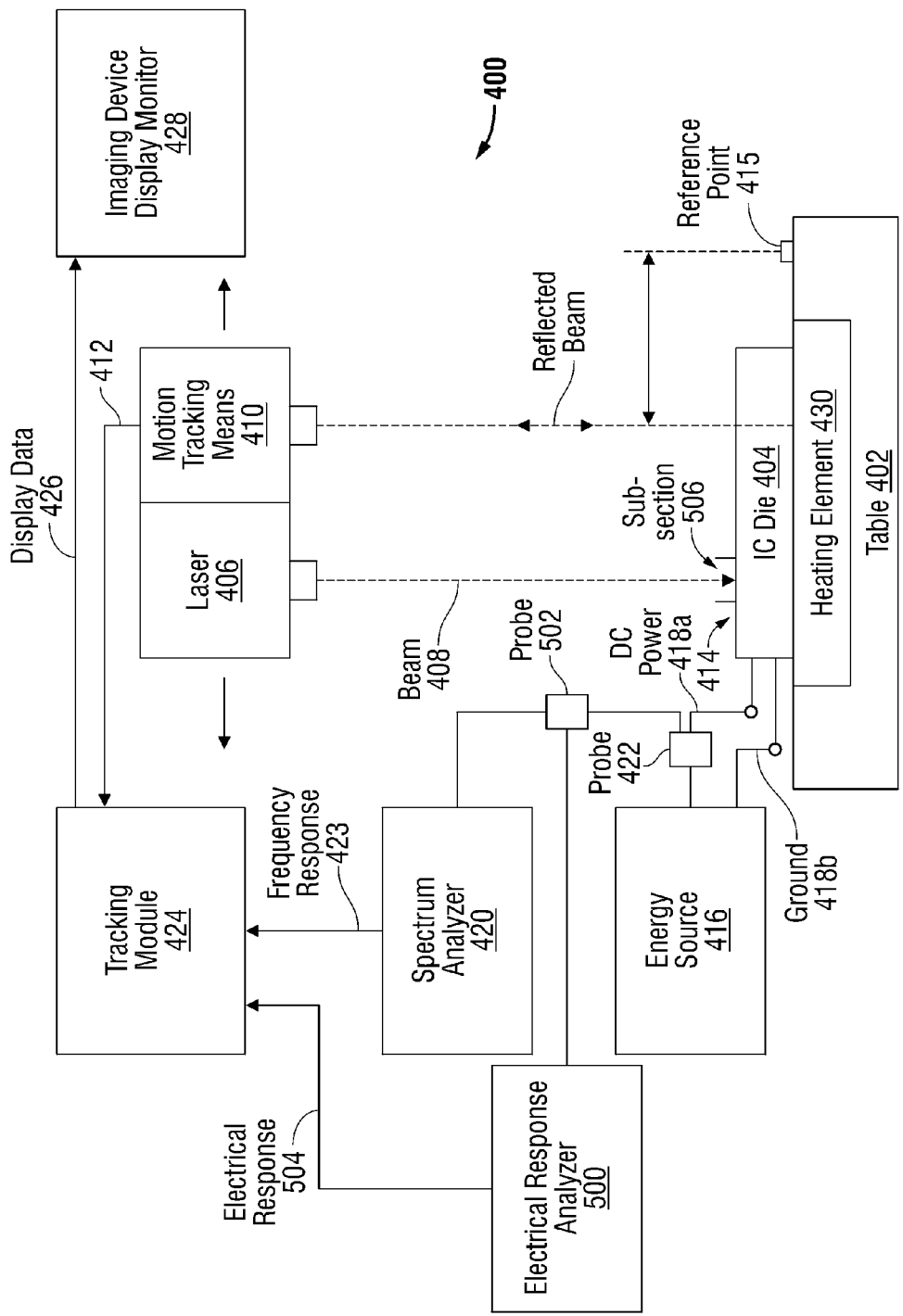
FIG. 5 is a schematic block diagram depicting a first variation of the TINA system of FIG. 4.

FIG. 5 is a schematic block diagram depicting a first variation of the TINA system of FIG. 4. In this aspect the system further comprises an electrical response analyzer 500 having a probe 502 connected to the IC die electrical interface 418, and an output on line 504 to supply a signal representing a measured electrical current or voltage response exceeding an electrical response threshold. For simplicity, the electrical measurement is being made on the same interface on which the power is supplied (line 418a). However, measurements may be taken on any of the IC electrical interfaces. As with the frequency measurements, the electrical response threshold is a variable whose value is dependent upon the particular circuits, stimulus signals, dc voltage, and temperature.

The tracking module 424 accepts the electrical response measurements on line 504, and correlates irradiated locations to electrical responses. The tracking module 424 determines IC defect regions in response to a combination of location-correlated frequency measurements (as explained above in the description of FIG. 4) and location-correlated electrical measurements exceeding an electrical response threshold. In one aspect, the tracking module is embedded with the electrical response analyzer.

In another aspect, the tracking module 424 accepts electrical response and frequency response measurements performed simultaneously. That is, the electrical and frequency response measurements are made in the same laser scan. Alternately, the electrical response measurements can be used as a coarse determination mechanism and the frequency response measurements as a fine determination of defects. That is, the tracking module 424 may initially determine potential IC defect regions in response to electrical responses measured in a first scan of a first area of the IC die surface 414 (e.g., the entire surface 414), and verify the IC defect regions in response to frequency responses measured in a second scan of a subsection 506 of the first area.

Figure 6:
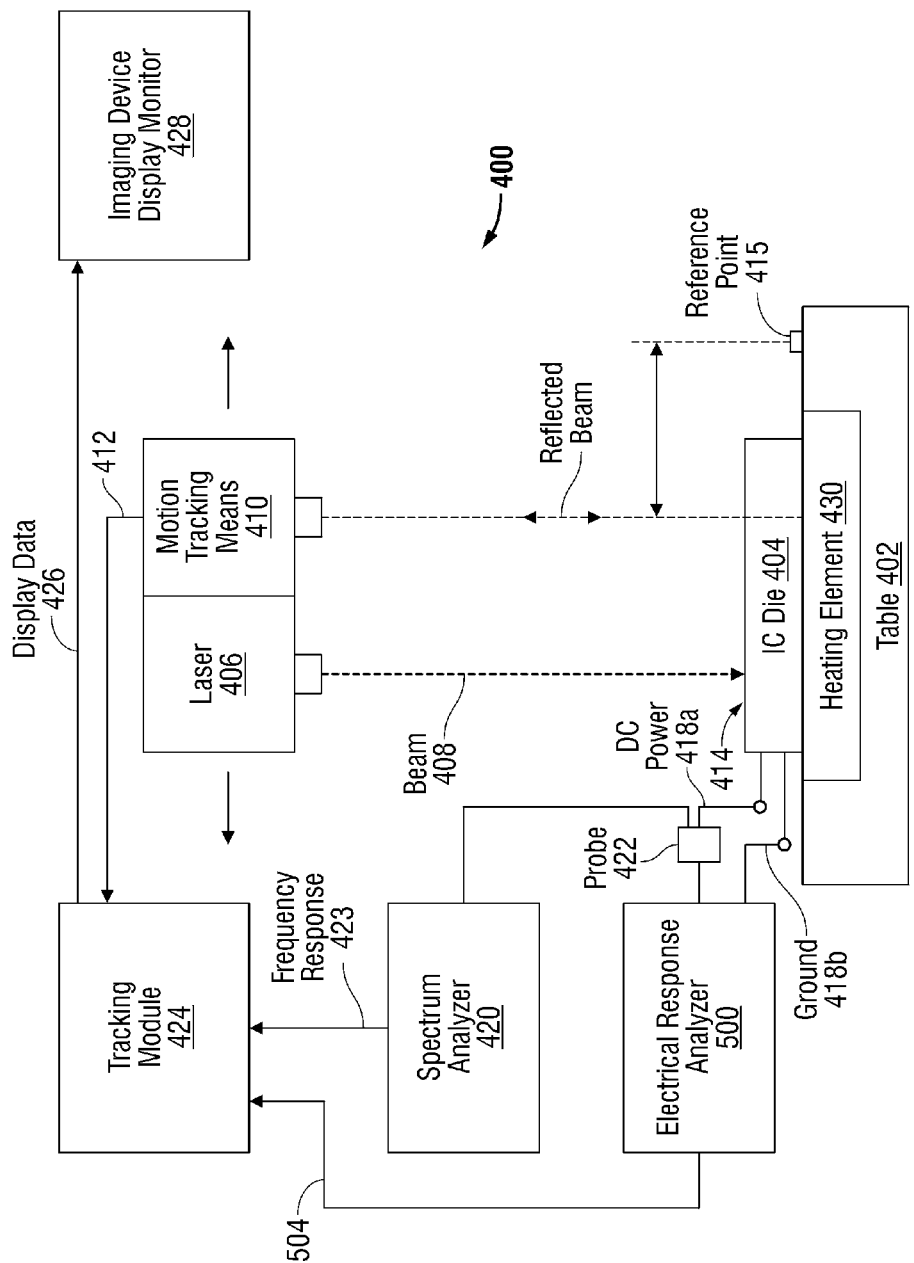
FIG. 6 is a schematic block diagram depicting a second variation of the TINA system of FIG. 4.

FIG. 6 is a schematic block diagram depicting a second variation of the TINA system of FIG. 4. In this aspect the electrical response analyzer 500 is the energy source supplying power to an electrical interface of the IC die. A conventional TIVA amplifier could be used to perform both the power supply and the electrical response measurements.

Figure 7:
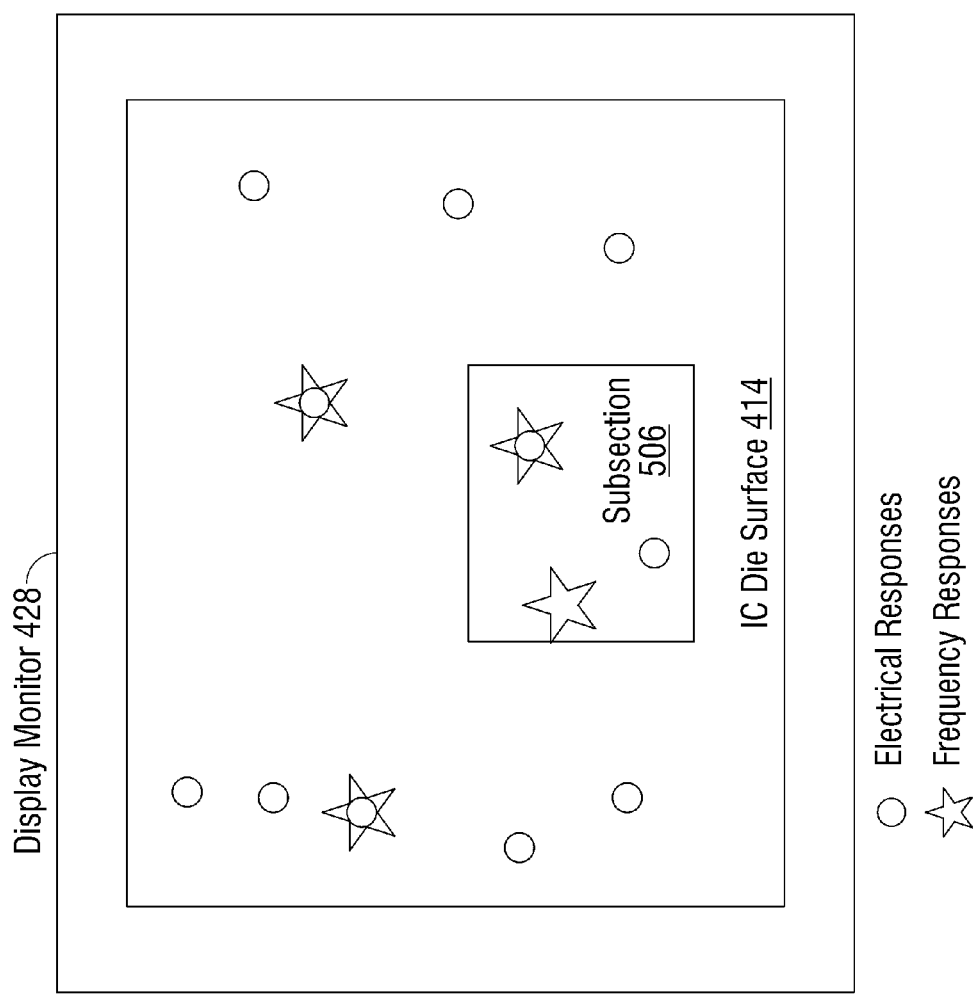
FIG. 7 is a diagram depicting display data, such as might be seen on the imaging device display monitor of FIG. 5.

FIG. 7 is a diagram depicting display data, such as might be seen on the imaging device display monitor of FIG. 5. The display 428 shows a plan view of the IC die top surface 414, with subsection 506. The circles represent electrical response measurements that exceed the electrical response threshold. The "stars" represent frequency response measurements that exceed the frequency response threshold. Note that the stars typically overlie the circles. A region with an overlying circle and star has a high likelihood of being associated with a defective part.

Functional Description

Conventional TIVA analysis, without noise analysis, does not indicate a difference between a normal (non-defective) thermally sensitive site and a defect that is thermally sensitive. The system shown in FIGS. 4 through 6 is a means of differentiating a normal thermally sensitive site from a defect site. This differentiation can be made because defects generate more noise and characteristic types of noise can be captured and examined with a spectrum analyzer. While the prior art identifies thermally sensitive sites based upon a static level of thermal sensitivity, the present invention system displays the time varying noise as a plot of frequency versus amplitude, so that the nature of the noise can be studied and classified.

For simplicity, the identification of defect regions has been correlated to amplitude or spectral density thresholds. However, a deeper analysis of defects may be based upon frequency related characteristics of the measured noise. For example, mechanical type defects such as bad connections, intermittent connections, cracks, bridging filaments produce "popcorn noise". Another group type is junction leakage, gate oxide resistive shorts, crystal defects, that produce a noise distribution that is a bump (often called a Lorentzian bump) on top of the normal 1/F noise plot. Other noise correlations to defects types are known in the art.

Figure 8:
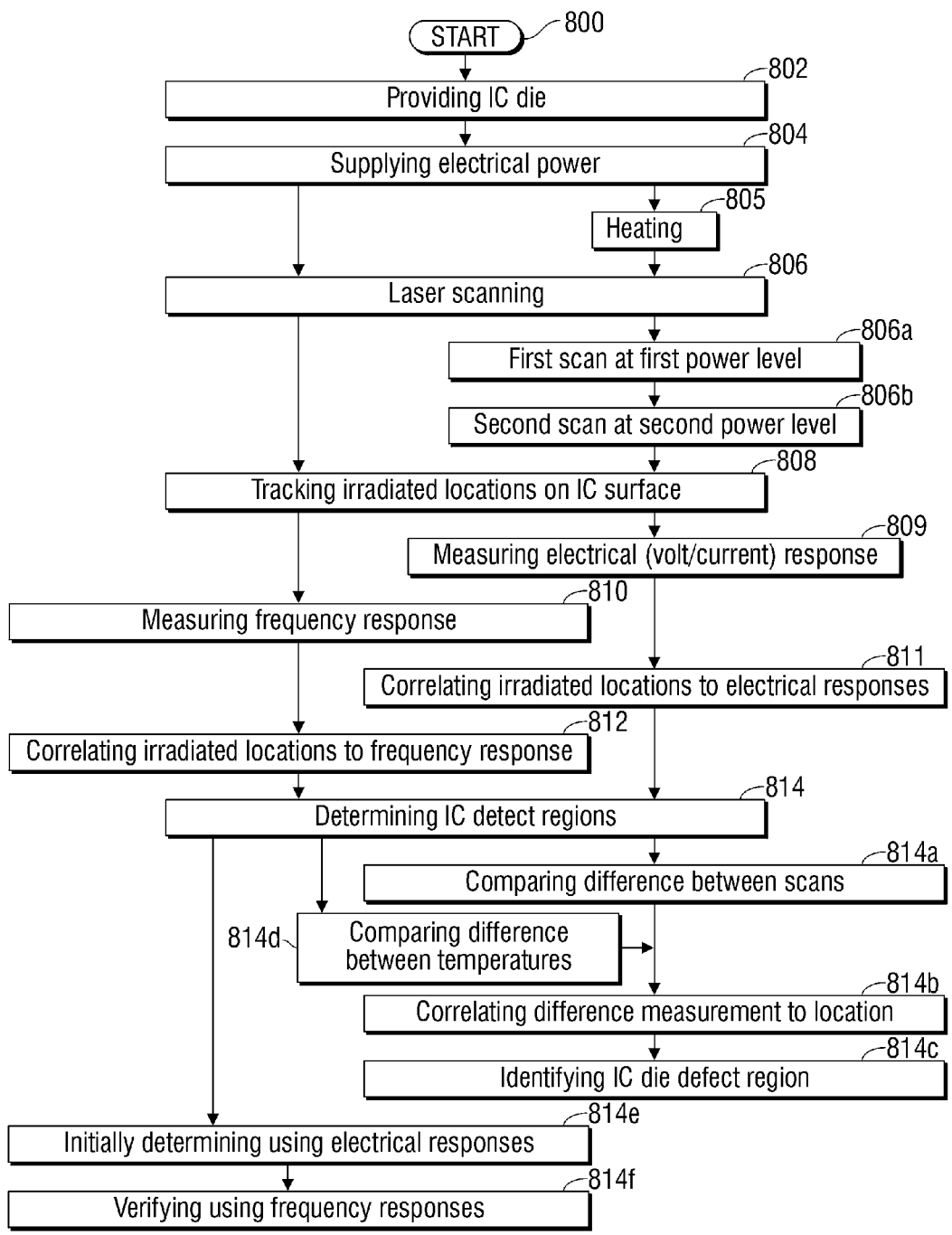
FIG. 8 is a flowchart illustrating a method for testing an IC using thermally induced noise analysis.

FIG. 8 is a flowchart illustrating a method for testing an IC using thermally induced noise analysis. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 provides an IC die. Step 804 supplies electrical power to the IC die. Step 806 scans an IC die surface with a laser. Scanning the IC die surface with a laser heats active electrical elements underlying the scanned IC die surface. Step 808 tracks laser beam irradiated locations on the IC die surface. Step 810 measures a frequency response of an IC die electrical interface. Step 812 correlates irradiated locations to frequency measurements. Step 814 determines IC die defect regions in response to location-correlated frequency measurements exceeding a noise threshold.

For example, correlating irradiated locations to frequency measurements in Step 812 may includes correlating a first die surface location to a first frequency measurement. Then, determining IC die defect regions in response to the frequency measurements exceeding the noise threshold in Step 814 includes identifying circuitry underlying the first die surface area in response to the first frequency measurement exceeding the noise threshold. Typically, Step 814 determines die defect regions in response a frequency measurement exceeding a minimum spectral density in a frequency range between about 1 Hertz and 10 kilohertz. However as noted above, other types of frequency analysis are known to identify defects.

In one aspect, scanning the IC die surface with the laser in Step 806 includes substeps. In a first scan, Step 806a scans the IC die surface at a first power level. In a second scan, Step 806b scans the IC die at a second power level, greater than the first power level. Then, determining IC die defect regions in response to frequency measurements exceeding a noise threshold (Step 814) includes the following substeps. Step 814a compares the difference in frequency measurement amplitudes between the first and second scans. If the difference exceeds a noise delta threshold, Step 814b correlates the difference measurement to an IC die location, and Step 814c identifies the location as an IC die defect region.

In another aspect prior to laser scanning (Step 806), Step 805 heats the IC die to a first temperature. Then, Step 806 instantaneously heats local regions of the IC die to a second temperature, greater than the first temperature. Step 814 determines IC die defect regions with an additional substep (Step 814d) of comparing the difference in frequency measurement amplitudes between frequency response measurements taken at the first and second temperatures. If the difference exceeds a noise delta threshold, Step 814b correlates the difference measurement to an IC die location, and Step 814c identifies the location as an IC die defect region.

In a different aspect, Step 809 measures an electrical voltage or current response of an IC die electrical interface. Step 811 correlates irradiated locations to electrical responses. Then, Step 814 determines IC defect regions in response to a combination of location-correlated frequency measurements and location-correlated electrical measurements exceeding an electrical response threshold.

In one aspect, the electrical response measurement (Step 809) and frequency response measurements (Step 810) are performed simultaneously. Alternately, scanning the IC die surface with a laser in Step 806 includes scanning a first area of the IC die surface in a first laser scan and a subsection of the first area in a second laser scan. Then, determining IC die defect regions in Step 814 includes alternate substeps. Step 814e initially determines potential IC defect regions in response to electrical responses measured in the first scan. Step 814f verifies the IC defect regions in response to frequency responses measured in the second scan.

A system and method have been provided for IC testing using thermally induced noise analysis of electrical signals. Examples of test fixtures and procedures have been given to illustrate the invention. However, the invention is not limited to merely these examples. Other variations and embodiments of the invention will occur to those skilled in the art.

I claim:

1. A method for testing an integrated circuit (IC) using thermally induced noise analysis, comprising:
  scanning a powered IC die surface with a laser;
  tracking laser beam irradiated locations on the IC die surface;
  measuring a frequency response of an electrical signal received from an IC die electrical interface during the scanning of the powered IC die surface with the laser;
  correlating irradiated locations to frequency measurements; and,
  determining IC die defect regions in response to location-correlated frequency measurements exceeding a noise threshold.

2. The method of claim 1 wherein correlating irradiated locations to frequency measurements comprises correlating a first die surface location to a first frequency measurement; and,
  wherein determining IC die defect regions in response to the frequency measurements exceeding the noise threshold comprises identifying circuitry underlying the first die surface area in response to the first frequency measurement exceeding the noise threshold.

3. The method of claim 1 wherein determining IC die defect regions in response to the frequency measurements exceeding the noise threshold comprises determining die defect regions in response a frequency measurement exceeding a minimum spectral density in a frequency range between about 1 Hertz and 10 kilohertz.

4. The method of claim 1 further comprising:
  measuring an electrical response of an IC die electrical interface, where the electrical response comprises current or voltage;
  correlating irradiated locations to electrical responses; and,
  wherein determining IC die defect regions comprises determining IC defect regions in response to a combination of location-correlated frequency measurements and location-correlated electrical measurements exceeding an electrical response threshold.

5. The method of claim 4 wherein the electrical response and frequency response measurements are performed simultaneously.

6. The method of claim 4 wherein scanning the IC die surface with a laser comprises scanning a first area of the IC die surface in a first laser scan and a subsection of the first area in a second laser scan;
  wherein determining IC die defect regions in response to the combination of frequency measurements and electrical measurements comprises:
    initially determining potential IC defect regions in response to electrical responses measured in the first scan; and,
    verifying the IC defect regions in response to frequency responses measured in the second scan.

7. The method of claim 1 wherein scanning the IC die surface with a laser comprises heating active electrical elements underlying the scanned IC die surface.

8. The method of claim 1 wherein scanning the IC die surface with the laser comprises:
  scanning the IC die surface at a first power level during a first scan;
  scanning the IC die surface at a second power level, greater than the first power level during a second scan, wherein the second scan takes place after the first scan;
  wherein determining IC die defect regions in response to frequency measurements exceeding a noise threshold comprises:
    comparing a difference in frequency measurement amplitudes between the first and second scans, wherein compared frequency measurement amplitudes between the first and second scans have matching correlated irradiated locations;
    if the difference exceeds a noise delta threshold, correlating the difference measurement to an IC die location; and,
    identifying the location as an IC die defect region.

9. The method of claim 1 further comprising:
  prior to laser scanning, heating the IC die to a first temperature; and,
  wherein scanning the IC die surface with the laser comprises instantaneously heating local regions of the IC die to a second temperature, greater than the first temperature, wherein the IC die is scanned in a first scan at the first temperature and then scanned in a second scan at the second temperature; and,
  wherein determining IC die defect regions in response to frequency measurements exceeding a noise threshold comprises:
    comparing a difference in frequency measurement amplitudes between frequency response measurements taken during the first and second scans, wherein compared frequency measurement amplitudes between the first and second scans have matching correlated irradiated locations;
    if the difference exceeds a noise delta threshold, correlating the difference measurement to an IC die location; and,
    identifying the location as an IC die defect region.

10. An integrated circuit (IC) thermally induced noise analysis system, comprising:

a laser for supplying a laser beam;

a motion tracking means for tracking the relative position of a powered IC die with respect to the laser, having an output to supply a signal representing irradiated locations on the IC die surface;

a spectrum analyzer having a probe connected to an IC die electrical interface and an output to supply an electric signal representing frequency response measurements of a signal received, from the IC die electrical interface, in response to the laser beam scanning of the powered IC die surface with the laser; and, a tracking module having inputs to accept the irradiated locations and frequency response measurements, for correlating frequency response measurements to IC die surface locations, the tracking module having an output to supply a signal representing IC die defect regions determined in response to location-correlated frequency measurements exceeding a noise threshold.

11. The system of claim 10 wherein the tracking module supplies display data representing the IC die surface and location-correlated frequency measurements exceeding the noise threshold; and, the system further comprising: an imaging device having an input to accept the display data from the tracking module and an output to supply an image depicting IC die defect regions on the IC die surface.

12. The system of claim 11 wherein the imaging device comprises an electronic display monitor or a printer.

13. The system of claim 10 wherein the spectrum analyzer output supplies a signal representing frequency response measurements in a frequency range between about 1 Hertz and 10 kilohertz.

14. The system of claim 10 further comprising:

an electrical response analyzer having a probe connected to the IC die electrical interface and an output to supply a signal representing a measured electrical response comprising current or voltage, exceeding an electrical response threshold; and, wherein the tracking module accepts the electrical response measurements, correlates irradiated locations to electrical responses, and determines IC defect regions in response to a combination of location-correlated frequency measurements and location-correlated electrical measurements exceeding an electrical response threshold.

15. The system of claim 14 wherein the tracking module accepts electrical response and frequency response measurements performed simultaneously.

16. The system of claim 14 wherein the tracking module initially determines potential IC defect regions in response to electrical responses measured in a first scan of a first area of the IC die surface, and verifies the IC defect regions in response to frequency responses measured in a second scan of a subsection of the first area.

17. The system of claim 14 where the electrical response analyzer is the energy source supplying power to an electrical interface of the IC die.

18. The system of claim 10 wherein the laser heats active electrical elements underlying the scanned IC die surface.

19. The system of claim 10 wherein the laser scans the IC die surface at a first power level in a first scan and scans the IC die at a second power level, greater than the first power level, in a second scan, wherein the second scan takes place after the first scan; and, wherein the tracking module compares a difference in frequency measurement amplitudes between the first and second scans, and if the difference exceeds a noise delta threshold, correlates the difference measurement to an IC die location, and identifies the location as a IC die defect region, wherein compared frequency measurement amplitudes between the first and second scans have matching correlated irradiated locations.

20. The system of claim 10 wherein the table comprises a heating element to heat the IC die to a first temperature;

wherein the laser instantaneously heats local regions of the IC die to a second temperature, greater than the first temperature, wherein the IC die is scanned in a first scan at the first temperature and then scanned in a second scan at the second temperature; and, wherein the tracking module compares a difference in frequency measurement amplitudes between the frequency response measurements taken during the first and second scans, wherein compared frequency measurement amplitudes between the first and second scans have matching correlated irradiated locations, and if the difference exceeds a noise delta threshold, correlates the difference measurement to an IC die location, and identifies the location as a IC die defect region.

* * * * *